(12) United States Patent
Simpson et al.

(10) Patent No.: US 8,318,405 B2
(45) Date of Patent: Nov. 27, 2012

(54) NEGATIVE-WORKING IMAGEABLE ELEMENTS WITH OVERCOAT

(75) Inventors: Christopher D. Simpson, Osterode (DE); Harald Baumann, Osterode/Harz (DE); Udo Dwars, Herzberg/Harz (DE); Bernd Strehmel, Berlin (DE)

(73) Assignee: Eastman Kodak Company, Rochester, NY (US)

( * ) Notice: Subject to any disclaimer, the term of this patent is extended or adjusted under 35 U.S.C. 154(b) by 652 days.

(21) Appl. No.: 12/403,458

(22) Filed: Mar. 13, 2009

(65) Prior Publication Data

US 2010/0233445 A1 Sep. 16, 2010

(51) Int. Cl.
*B32B 3/10* (2006.01)
*G03F 7/09* (2006.01)
*G03F 7/11* (2006.01)

(52) U.S. Cl. ................... 430/273.1; 430/302

(58) Field of Classification Search ............. None
See application file for complete search history.

(56) References Cited

U.S. PATENT DOCUMENTS

| | | | |
|---|---|---|---|
| 4,267,265 A | 5/1981 | Sugimoto et al. | |
| 5,776,655 A * | 7/1998 | West et al. ............ | 430/256 |
| 6,313,182 B1 | 11/2001 | Lassila et al. | |
| 7,172,847 B2 | 2/2007 | Goto | |
| 2005/0175934 A1 | 8/2005 | Koizumi | |
| 2007/0224543 A1 | 9/2007 | Griess et al. | |
| 2007/0281246 A1 | 12/2007 | Hirabayashi | |
| 2008/0299488 A1 | 12/2008 | Yu et al. | |

FOREIGN PATENT DOCUMENTS

| | | |
|---|---|---|
| EP | 0 907 107 | 4/1994 |
| EP | 1 085 380 | 3/2001 |
| EP | 1 276 013 A2 | 1/2003 |
| EP | 1 720 065 | 11/2006 |
| EP | 1 757 984 | 2/2007 |
| EP | 1 767 994 | 3/2007 |
| EP | 1 862 301 A1 | 12/2007 |
| JP | 2004038088 A * | 2/2004 |
| JP | 2008145569 A * | 6/2008 |

OTHER PUBLICATIONS

English translation of JP, JP 2008-145569 A(2008)) from machine translation from AIPN Japan Patent Office National center for Industrial Property Information and Training, generated Sep. 27, 2011, 24 pages.*
SciFinder abstract Accession No. 2008:772246, CAN 149:91491 from CAPLUS file of Scifinder database, English abstract of Jp 2008-145569 a with a publication date of Jun. 26, 2008, 2 pages.*
SciFinder abstract Accession No. 2004:98022, CAN 140:154498 from CAPLUS file of Scifinder database, English abstract of Jp 2004-038088a with a publication date of Feb. 5, 2004, 3 pages.*
Kuraray POVAL product list dated Sep. 9, 2006 by http://web.archive.org/web/20060909201015/http://www.poval.jp/english/poval/gradelist/poval_list.pdf at Wayback web search, one page.*
English translation of JP 2004-038088 A (2004)) from machine translation from AIPN Japan Patent Office National center for Industrial Property Information and Training, generated Oct. 2, 2011, 26 pages.*
RN 57534-41-5 registry No. from Registry finels ACS on STN one page, enterd STN Nov. 16, 1984.*
U.S. Appl. No. 12/336,635, filed Dec. 17, 2008, titled "Stack of Negative-Working Intiageable Elements" by Kevin Ray et al.

* cited by examiner

*Primary Examiner* — Cynthia Hamilton
(74) *Attorney, Agent, or Firm* — J. Lanny Tucker

(57) ABSTRACT

Negative-working imageable element can be used to provide lithographic printing plates. The imageable element has a suitable radiation-sensitive imageable layer and a water-soluble overcoat disposed on the imageable layer. This overcoat comprises at least one poly(vinyl alcohol) having a saponification degree of at least 90%, an alkoxylation product of an alkanol, and either a 2-sulfonato succinic acid dialkylester or an alkoxylation product of a 1,4-butanediol.

14 Claims, No Drawings

NEGATIVE-WORKING IMAGEABLE ELEMENTS WITH OVERCOAT

FIELD OF THE INVENTION

This invention relates to negative-working imageable elements having improved overcoat layers that can be used to prepare lithographic printing plates. This invention also relates to a method of providing imaged and processed lithographic printing plates.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics. Such compositions are generally provided as imageable layers.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Because the presence of oxygen in the air can diminish the sensitivity of the radiation-sensitive composition, a hydrophilic oxygen-blocking protective layer (protective overcoat) is generally disposed over the radiation-sensitive composition. While it is known that good latent image keeping requires such as overcoat comprising a poly(vinyl alcohol) having a high saponification degree, if the saponification degree is too high, coating defects are too common because of the high dynamic contact angles formed with the poly(vinyl alcohol) coating solutions on the radiation-sensitive composition. The dynamic contact angle can be reduced by adding surfactants to the overcoat composition, but it is unpredictable about which surfactants will perform satisfactorily so the overcoat layer has the desired coefficient of friction in reference to interleaf papers used to separate printing plate precursors. Thus, the overcoat must be carefully designed to have a combination of properties.

SUMMARY OF THE INVENTION

The present invention provides a negative-working imageable element comprising a substrate and having thereon a radiation-sensitive imageable layer, the imageable element further comprising a water-soluble overcoat disposed on the imageable layer, the overcoat comprising a poly(vinyl alcohol) having a degree of saponification of at least 90%, an alkoxylation product of an alkanol, and either a 2-sulfonato succinic acid dialkylester or an alkoxylation product of a 1,4-butynediol.

This invention also provides a method of providing a lithographic printing plate comprising:

A) imagewise exposing an imageable element of the present invention to provide exposed and non-exposed regions, and B) processing the imagewise exposed imageable element to remove predominantly only the non-exposed regions The method of this invention is particularly useful for providing lithographic printing plates.

We have found that several problems can be solved with the present invention. Specifically, we have discovered that the imageable elements of this invention comprise a water-soluble overcoat that is an effective oxygen barrier at high humidity. This overcoat is prepared using a formulation that has a low tendency to foaming. We observed that the overcoat had a lower rate of coating defects and a coefficient of dynamic friction of, for example from about 0.25 to about 0.5 when in contact with interleaf paper.

We discovered these advantages when we used a combination of a specific poly(vinyl alcohol), an alkoxylation product of an alkanol, and either a 2-sulfonato succinic acid dialkylester or an alkoxylation product of a 1,4-butynediol in the overcoat formulation.

DETAILED DESCRIPTION OF THE INVENTION

Unless the context indicates otherwise, when used herein, the terms "imageable element", "negative-working imageable element", and "lithographic printing plate precursor" are meant to be references to embodiments of the present invention.

In addition, unless the context indicates otherwise, the various components described herein such as "radically polymerizable component", "radiation absorbing compound", "polymeric binder", "initiator", "water-soluble polymer", alkoxylation product of an alkanol", "2-sulfonato succinic acid dialkylester", "alkoxylation product of a 1,4-butynediol", and similar terms also refer to mixtures of such components. Thus, the use of the articles "a", "an", and "the" are not necessarily meant to refer to only a single component.

Moreover, unless otherwise indicated, percentages refer to percents by dry weight.

The imageable elements of this invention are generally "single-layer" imageable elements by which we mean that the elements contain only one imageable layer that is essential for imaging and this layer is not the outermost layer, as such elements also include a topcoat disposed over the imageable layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

A general description about H-aggregates can be found in: A. Herz, "Aggregation of sensitizing Dyes in Solution and Their Adsorption onto Silver Halides", *Advances in Colloid and Interface Science,* 8 (1977) 237-298; M. Kasha, H. R. Rawls, M. Ashraf El-Bayoumi, "The Exciton Model in Molecular Spectroscopy", *Pure and Applied Chemistry* (1965), 11(3-4), 371-92; W. West, S. Pearce, "The Dimeric State of Cyanine Dyes" The *Journal of Physical Chemistry,* (1965), 69(6), 1894-1903; and A. H. Herz, R. P. Danner, G. A. Janusonis, Adsorption of Dyes and Their Surface Spectra" *Advan. Chem. Ser.* (1968), 79, 173-197.

Imageable Layers

The imageable elements include a radiation-sensitive composition disposed on a suitable substrate to form an imageable layer. The imageable elements may have any utility wherever there is a need for an applied coating that is crosslinkable using suitable imaging radiation, and particularly where it is desired to remove non-exposed regions of the coating instead of exposed regions. The radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used. In some embodiments, the radically polymerizable component may comprise carboxy groups.

Particularly useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of these classes of materials. More particularly useful free radically polymerizable compounds include those derived from urea urethane (meth)acrylates or urethane (meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other useful free radically polymerizable compounds include NK Ester A-DPH (dipentaerythritol hexaacrylate) that is available from Kowa American, and free radically polymerizable compounds are available from Sartomer Company, Inc. such as Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20) trimethylolpropane triacrylate], and others that would be readily apparent to one skilled in the art.

Also useful are urea urethane (meth)acrylates and urethane (meth)acrylates described in U.S. Pat. No. 6,582,882 (noted above), U.S. Pat. No. 6,899,994 (noted above), and U.S. Pat. No. 7,153,632 (Saraiya et al.) and WO 2007/077207, all of which are incorporated herein by reference.

Numerous other free radically polymerizable compounds are known to those skilled in the art and are described in considerable literature including *Photoreactive Polymers: The Science and Technology of Resists*, A Reiser, Wiley, N.Y., 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170].

The free radically polymerizable component is present in the radiation-sensitive composition in an amount sufficient to render the composition insoluble in an aqueous developer after exposure to radiation. This is generally from about 10 to about 70 weight % and typically from about 20 to about 50 weight % based on the dry weight of the radiation-sensitive composition.

The radiation-sensitive composition includes an initiator composition that is capable of generating radicals sufficient to initiate polymerization of the radically polymerizable component upon exposure to the appropriate imaging radiation. The initiator composition may be responsive, for example, to electromagnetic radiation in the infrared spectral regions, corresponding to the broad spectral range of from about 700 nm to about 1400 nm, and typically from about 700 nm to about 1200 nm. Alternatively, the initiator composition may be responsive to exposing radiation in the violet region of from about 250 to about 450 nm and typically from about 300 to about 450 nm.

There are numerous compounds known in the literature that can be used in this manner including but not limited to, organic boron salts, s-triazines, benzoyl-substituted compounds, onium salts (such as iodonium, sulfonium, diazonium, and phosphonium salts), trihaloalkyl-substituted compounds, metallocenes (such as titanocenes), ketoximes, thio compounds, organic peroxides, or a combination of two or more of these compounds. Hexaarylbiimidazoles, onium compounds, and thiol compounds as well as mixtures of two or more thereof are desired coinitiators or free radical generators, and especially hexaarylbiimidazoles and mixtures thereof with thiol compounds are useful.

Suitable hexaarylbiimidazoles are for example represented by the following formula:

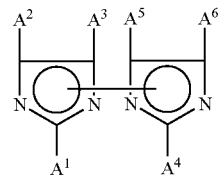

wherein $A^1$-$A^6$ are substituted or unsubstituted $C_5$-$C_{20}$ aryl groups that are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, for example halogen atoms (fluorine, chlorine, bromine, and iodine), —CN, $C_1$-$C_6$ alkyl (optionally with one or more substituents selected from halogen atoms, —CN and —OH), $C_1$-$C_6$ alkoxy, $C_1$-$C_6$ alkylthio, and ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Suitable hexaarylbiimidazoles are for example described in U.S. Pat. No. 4,565,769 (Dueber et al.) and U.S. Pat. No. 3,445,232 (Shirey) and can be prepared according to known methods, such as the oxidative dimerization of triarylimidazoles. A summary of the chemistry of hexaarylbiimidazoles is found in the following reference: R. Dessauer, "The Invention of Dylux Instant-Access Imaging Materials and the Development of HABI Chemistry-A Personal History" in *Advances in Photochemistry*, D. C. Neckers, W. S. Jenks, T. Wolff (Eds.), Vol. 28, John Wiley & Sons, Hoboken, N.J., 2005, pp. 129-261.

In the present invention, one or more coinitiators can be used. Metallocenes are not suitable as coinitiators of the present invention since it has been found that they inter alia affect the yellow light stability.

The amount of coinitiator(s) is not particularly restricted. However, it is generally in the range of from about 0.2 to about 25 wt. %, or typically from about 0.5 to about 15 wt. %, based on the dry layer weight.

Other suitable initiator compositions comprise compounds that include but are not limited to, amines (such as alkanol amines), thiol compounds, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety, "co-initiators" described in U.S. Pat. No. 5,629,354 of West et al., oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile) as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (Huang et al.).

The IR-radiation sensitive initiator compositions generally comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), U.S. Pat. No. 6,051,366 (Baumann et al.), and U.S. Pat. No. 7,368,215 (Munnelly et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N+). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Some useful boron components include organic boron salts that include an organic boron anion such as those described in U.S. Pat. No. 6,569,603 (noted above) that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the IR radiation-sensitive composition.

Useful IR radiation-sensitive initiator compositions can comprise one or more diaryliodonium borate compounds, each of which is represented by the following Structure (II):

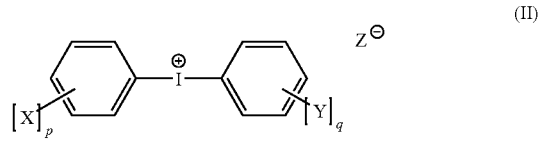

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). For example, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are useful (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure II, p and q are independently 0 or integers of 1 to 5, provided that either p or q is from about 1. For example, both p and q can be 1. Thus, it is understood that the carbon atoms in the phenyl rings that are not substituted by X or Y groups have a hydrogen atom at those ring positions.

$Z^-$ is an organic borate anion represented by the following Structure (III):

(III)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

For example, $R_1$, $R_2$, $R_3$, and $R_4$ are independently substituted or unsubstituted alkyl or aryl groups as defined above, or at least 3 of $R_1$, $R_2$, $R_3$, and $R_4$ are the same or different substituted or unsubstituted aryl groups (such as substituted or unsubstituted phenyl groups). In some embodiments, all of $R_1$, $R_2$, $R_3$, and $R_4$ are the same or different substituted or unsubstituted aryl groups or, all of the groups are the same substituted or unsubstituted phenyl group. For example, $Z^-$ is a tetraphenyl borate wherein the phenyl groups are substituted or unsubstituted.

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The initiator composition including one or more initiator compounds is generally present in the radiation-sensitive composition in an amount of from about 0.5% to about 30%, based on the total solids of the radiation-sensitive composition or the dry weight of the coated imageable layer. For example, the initiator composition is present in an amount of from about 2% to about 20 weight %. In the most embodiments, one or more diaryliodonium borate compounds generally comprise from about 10 to about 100% of the initiator composition.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 375 nm and up to and including 475 nm.

Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated $\pi$-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful sensitizers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

The IR radiation-sensitive composition sensitivity is provided by the presence of one or more infrared radiation absorbing compounds, chromophores, or sensitizers that absorb imaging radiation, or sensitize the composition to imaging infrared radiation having a $\lambda_{max}$ of from about 700 nm and up to and including 1400 nm, and typically from about 700 to about 1200 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The radiation absorbing compounds (or sensitizers) can be present in the radiation sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to a skilled worker in the art.

The radiation-sensitive composition includes one or more polymeric binders that are generally used for off-press developability include any alkaline solution soluble (or dispersible) polymer having an acid value of from about 20 to about 400 (typically from about 30 to about 200). The following described polymeric binders are particularly useful in the manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms. One way to represent a tertiary carbon atom in the all carbon backbone is with the following Structure (T-CARBON):

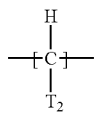

(T-CARBON)

wherein $T_2$ is a group other than hydrogen provided that $T_2$ does not include an ethylenically unsaturated free radically reactive group (such as a —C=C— group). In many embodiments, $T_2$ is a pendant group selected from N-carbazole, aryl (defined similarly as for Ar below), halo, cyano, —C(=O)R, —C(=O)Ar, —C(=O)OR, —C(=O)OAr, —C(=O)NHR, and —C(=O)NHAr pendant groups, wherein R is hydrogen or an alkyl, cycloalkyl, halo, alkoxy, acyl, or acyloxy group, and Ar is an aryl group other than a styryl group. The quaternary carbon atoms present in the all carbon backbone of the polymeric binder can also have the same or different pendant groups filling two of the valences. For example, one or both valences can be filled with the same or different alkyl groups as defined above for R, or one valence can be filled with an alkyl group and another valence can be filled with a N-carbazole, aryl other than a styryl group, halo, cyano, —C(=O)R, —C(=O)Ar, —C(=O)OR, —C(=O)OAr, —C(=O)NHR, or —C(=O)NHAr pendant group, wherein R and Ar are as defined above. The pendant groups attached to the tertiary and quaternary carbons in the all carbon backbone can be the same or different and typically, they are different. It should also be understood that the pendant groups attached to the various tertiary carbon atoms can be the same throughout the polymeric molecule, or they can be different. For example, the tertiary carbon atoms can be derived from the same or different ethylenically unsaturated polymerizable monomers. Moreover, the quaternary carbon atoms throughout the polymeric molecule can have the same or different pendant groups.

In some embodiments of this invention, the polymeric binder can be represented by the following Structure:

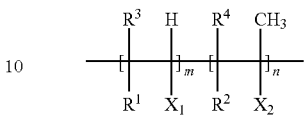

wherein m is at least 85 mol % and the sum of m and n is 100 mol %. In some embodiments, m is at least 89 mol %, and in other embodiments, m is from about 85 to 100 mol %. In this Structure, $R^1$ through $R^4$ are independently hydrogen or alkyl, cycloalkyl, aryl (other than styryl), halo, alkoxy, acyl, or acyloxy groups as defined above, and $X_1$ and $X_2$ are independently N-carbazole, aryl (other than styryl), halo, cyano, —C(=O)R, —C(=O)Ar, —C(=O)OR, —C(=O)OAr, —C(=O)NHR, or —C(=O)NHAr groups wherein R and Ar is as defined above. Alternatively, $R^1$ and $X_1$ together or $R^2$ and $X_2$ together can form a substituted or unsubstituted carbocyclic or heterocyclic ring. When either $R^2$ or $R^4$ is hydrogen, both are then hydrogen. For example, $R^1$ through $R^4$ can be independently hydrogen, methyl, or halo groups, and more likely, each is hydrogen. In addition, $X_1$ can be one or more of acetyl, phenyl (other than a styryl group), N-carbazole, cyano, carboxy ester, or carboxy amide pendant groups, and $X_2$ can be one or more carboxy ester or carboxy amide pendant groups.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

For example, the reactive vinyl group can be represented by the structure: —X—CR$^1$=C(R$^2$)R$^3$ wherein X, R$^1$, R$^2$, and R$^3$ are defined below.

Such primary polymeric binders can be represented by the following Structure:

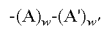

wherein A represents recurring units comprising one or more pendant reactive vinyl groups that are directly or indirectly attached to the hydrophobic polymeric backbone, A' represents recurring units other than those represented by A, w is from about 1 to about 70 mol %, and w' is from about 30 to about 99 mol %. Thus, the A' recurring units contain no pendant reactive vinyl groups.

For example, the reactive vinyl groups can be connected to the polymer backbone with a carbon-carbon direct bond or a linking group. For example, useful reactive vinyl groups are shown in Structure IIa and IIb below as Z' groups. The X linking groups may be an oxy (—O—), thio (—S—), carbonyloxy [—C(O)O—], carbonamido [—C(O)NR'—], carbonyl [—C(O)—], amido (—NR'—), sulfonyl [—S(=O)$_2$O—], substituted or unsubstituted arylene group (such as a substituted or unsubstituted phenylene group), or a substituted or unsubstituted alkylene group (having 1 to 10 carbon atoms, such as a methylene group), or combinations of two or more of these groups. In particular, X may be an oxy, thio, —NR'—, or substituted or unsubstituted arylene group having 6 to 10 carbon atoms in the ring (such as substituted or unsubstituted phenylene). R' can be hydrogen, a substituted or unsubstituted alkyl group having 1 to 6 carbon atoms, or a substituted or unsubstituted aryl group having 6 or 10 carbon atoms in the ring. In many embodiments, X is a direct bond or a carbonyloxymetheylene or a methyleneoxyphenylene group.

Z' is represented by the following Structure (IIa) or (IIb):

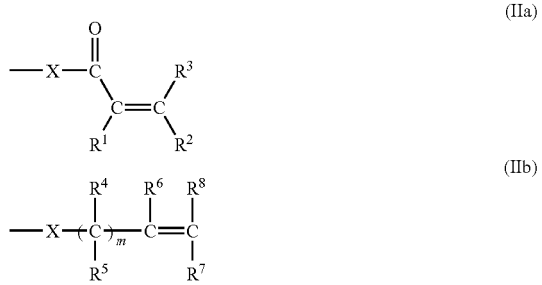

wherein X is defined as above.

R$^1$ to R$^8$ independently represent monovalent organic groups of which there are hundreds of possibilities including but not limited to, hydrogen, substituted or unsubstituted alkyl groups having 1 to 10 carbon atoms, substituted or unsubstituted cycloalkyl groups having 5 to 10 carbon atoms in the unsaturated ring, substituted or unsubstituted aryl groups having 6 to 10 carbon atoms in the aromatic ring, substituted or unsubstituted heterocyclyl groups having 5 to 10 carbon, nitrogen, sulfur, or oxygen atoms in the aromatic or non-aromatic rings, cyano, halo, and vinyl groups.

When the pendant groups comprise the moiety represented by Structure IIb, R$^4$ and R$^5$ can be independently hydrogen or a substituted or unsubstituted alkyl group having 1 to 3 carbon atoms, and R$^6$ to R$^8$ can be independently hydrogen, or a halo group, substituted or unsubstituted alkyl group having 1 to 6 carbon atoms, or a substituted or unsubstituted phenyl group.

For example, R$^6$ to R$^8$ can be independently hydrogen or a chloro, methyl, ethyl, or phenyl groups.

In Structure IIb, m is 0 or 1, and preferably it is 1.

For example, Z' can be represented by the following Structure IIc:

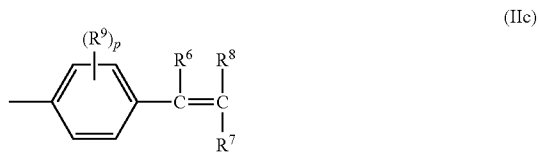

wherein R$^6$ through R$^8$ are as defined above, R$^9$ is a substitutable group or atom that would be readily apparent to one skilled in the art, and p is an integer of 0 to 4. Most preferably, p is 0, and R$^6$ through R$^8$ are hydrogens.

Some useful pendant reactive vinyl groups are alkenyl groups including but not limited to allyl esters, styryl, and (meth)acryloyl groups. For example, such groups can be provided by allyl (meth) acrylates, or by reacting a polymer precursor with an allyl halide, 4-vinylbenzyl chloride, or (meth)acryloyl chloride using conditions that would be apparent to a skilled worker in the art.

The A' recurring units can be derived from one or more of the polymerizable ethylenically unsaturated monomers that are described below for the B, C, and D recurring units. Generally, recurring units from at least one monomer from each of the B, C, and D groups are present in the desired molar amounts described below.

In some embodiments, the polymeric binder can be represented by the following Structure:

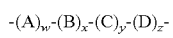

wherein A represents recurring units comprising a pendant allyl (meth)acrylate group that is directly or indirectly attached to the hydrophobic polymer backbone, B represents recurring units comprising pendant cyano groups, C represents recurring units comprising pendant acidic groups, D represents recurring units other than those represented by A, B, and C, w is from about 1 to about 70 mol %, x is from about 10 to about 80 mol %, y is from about 1 to about 30 mol %, and z is from 0 to about 90 mol %, The B recurring units are generally derived from one or more of (meth)acrylonitrile, cyanostyrenes, or cyano(meth)acrylates.

The C recurring units comprise one or more acidic groups such as carboxy, phosphoric acid, and sulfonic acid, as well as salts thereof (carboxylates, sulfonates, etc.). Monomers from such recurring units can be derived include but are not limited to, carboxy-containing vinyl monomers, carboxylated styrenes, and sulfated styrenes. Ethylenically unsaturated polymerizable monomers that have carboxy groups, or that have reactive groups that can be converted to carboxy groups, or to which carboxy groups can be attached after polymerization, are particularly useful. Thus, the carboxy groups can be obtained from a number of synthetic methods. Useful monomers having pendant carboxylic acid groups include but are not limited to, (meth)acrylic acid, 4-carboxyphenyl (meth)acrylate, and 4-carboxystyrene.

The D recurring units are derived from one or more of vinyl carbazole or vinyl carbazole derivatives as described in U.S. Pat. No. 7,175,949 (Tao et al.), alkyl (meth)acrylates [such as methyl (meth)acrylates], (meth)acrylamides, N-phenyl maleimides, poly(alkylene glycol) methyl ether (meth)acrylates [such as poly(ethylene glycol) methyl ether (meth)acrylates], and styrene monomers such as substituted and unsubstituted styrene. Useful combinations of D recurring units include a combination of recurring units derived from two or more of a methyl (meth)acrylate, an N-vinyl carbazole, and a polyethylene glycol methyl ether (meth)acrylate. These are merely provided as examples and not intended to be limiting since a skilled artisan could use many other ethylenically unsaturated polymerizable monomers.

V. Polymeric binders can have pendant 1H-tetrazole groups as described in U.S. Ser. No. 11/949,810 (Baumann et al.) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (typically from about 30 to about 500 nm). These hybrids can be either "aromatic" or "aliphatic" in nature depending upon the specific reactants used in their manufacture. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

The polymeric binder is generally present in the radiation-sensitive composition (and imageable layer) in an amount of at least 5 and up to 70 weight %, and typically from about 10 to about 50 weight % based on the total solids in the composition and layer.

The radiation-sensitive composition (and imageable layer) can also include a variety of optional compounds including but not limited to, dispersing agents, humectants, biocides, plasticizers, surfactants for coatability or other properties, viscosity builders, contrast dyes or colorants other than those described above (such as crystal violet, methyl violet, ethyl violet, Victoria Blue B, Victoria Blue R, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition that is directly applied to the substrate without any intermediate layer.

The imageable element also includes an overcoat (also known as "oxygen impermeable topcoat" or "oxygen barrier layer") disposed over the imageable layer. Such overcoat layers comprise one or more water-soluble poly(vinyl alcohol)s having a saponification degree of at least 90% and generally have a dry coating weight of at least 0.1 and up to and including 2 g/m$^2$ (typically from about 0.4 to about 2.5 g/m$^2$) in which the water-soluble poly(vinyl alcohol)s comprise at least 60% and up to 99% of the dry weight of the overcoat layer. In many embodiments, the overcoat comprises at least one poly(vinyl alcohol) having a saponification degree of from about 95 to about 99%.

The overcoat is designed so that, in its dry state, has a dynamic coefficient of friction of at least 0.25, or a dynamic coefficient of friction of at least 0.35, and generally up to 0.5.

The overcoat also contains an alkoxylation product of an alkanol, and either a 2-sulfonato succinic acid dialkylester or an alkoxylation product of a 1,4-butynediol.

The alkoxylation product of an alcohol is present in an amount of from about 0.05 to about 0.7 weight %, and is derived from a linear or branched $C_4$ to $C_{20}$ alcohol or oxy-alcohol.

The 2-sulfonato succinic acid $C_4$ to $C_{18}$ dialkylester or ethylene oxide or propylene oxide product of a 1,4-butynediol and is present in an amount of from about 0.1 to about 3 weight %.

For example, the 2-sulfonato succinic acid dialkylester and an alkoxylation product of a 1,4-butynediol are represented by the following Structures I and II, respectively:

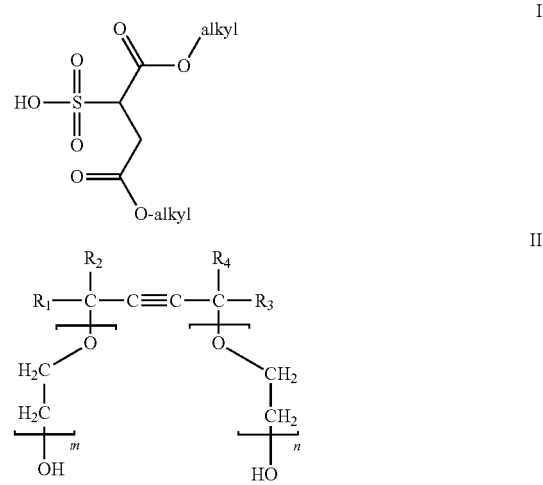

wherein "alkyl" represents an alkyl group having 4 to 18 carbon atoms, $R_1$ through $R_4$ are independently alkyl groups having 1 to 6 carbon atoms, and m and n are the same or different integers so that the sum of m and n is 1 to 30.

In some embodiments, the 2-sulfonato succinic acid dialkylester is represented by the following Structure III:

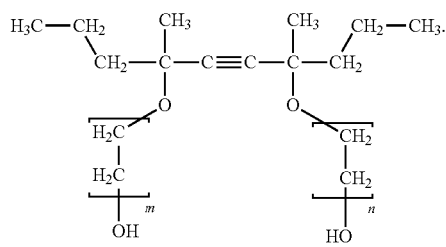

In some embodiments, the poly(vinyl alcohol) is present in the overcoat in an amount of from about 60 to about 99 weight %, the an alkoxylation product of an alkanol is present in an amount of at least 0.05 weight %, and the 2-sulfonato succinic acid dialkylester or alkoxylation product of a 1,4-butynediol are present in an amount of at least 0.1 weight %, all weight percentages based on overcoat total dry weight.

The overcoat can further comprise a second water-soluble polymer that is not a poly(vinyl alcohol) in an amount of from about 2 to about 38 weight %, and such second water-soluble polymer can be a poly(vinyl pyrrolidone), poly(ethyleneimine), poly(vinyl imidazole), poly(vinyl caprolactone), or a copolymer derived from two or more of vinyl pyrrolidone, ethyleneimine, vinyl caprolactone, and vinyl imidazole, and vinyl acetamide.

Thus, some embodiments of this invention include an overcoat wherein the alkoxylation product of an alcohol is present in an amount of from about 0.1 to about 0.5 weight %, the 2-sulfonato succinic acid $C_4$ to $C_{18}$ dialkylester or ethylene oxide or propylene oxide product of a 1,4-butynediol is present in an amount of from about 0.5 to about 2 weight %, the water-soluble poly(vinyl alcohol) is present in an amount of from about 80 to about 95 weight %, and the overcoat further comprises a second water-soluble polymer that is not a poly(vinyl alcohol) and that is present in an amount of from about 2 to about 17 weight %.

The various polymeric and non-polymeric components of the overcoat can be obtained from various commercial sources The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid-anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum substrate can be electrochemically-grained, sulfuric acid-anodized, and treated with PVPA or PF using known procedures.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

A radiation-sensitive composition and overcoat composition containing the components described above can be applied as a solution or dispersion in a coating liquid using any suitable equipment and procedure, such as spin coating, knife coating, gravure coating, die coating, slot coating, bar coating, wire rod coating, roller coating, or extrusion hopper coating. The compositions can also be applied by spraying onto a suitable support (such as an on-press printing cylinder).

Illustrative of such manufacturing methods is mixing the free radically polymerizable component, initiator composition, polymeric binder, radiation absorbing compound, and any other components of the radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents (mixtures) and imageable layer formulations are described in the Invention Examples below. After proper drying, the coating weight of the imageable layer is generally at least 0.1 and up to and including 5 $g/m^2$ or at least 0.5 and up to and including 3.5 $g/m^2$.

Imaging Conditions

During use, the imageable element is exposed to a suitable source of exposing radiation depending upon the radiation absorbing compound present in the radiation-sensitive composition, at a wavelength of from about 250 to about 450 nm or from about 700 to about 1500 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser (or array of lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 250 nm and up to and including 450 nm), can be carried out generally using energies of at least 0.01 mJ/cm$^2$ and up to and including 0.5 mJ/cm$^2$, and typically at least 0.02 and up to and including about 0.1 mJ/cm$^2$. It would be desirable, for example, to image the UV/visible radiation-sensitive imageable elements at a power density in the range of at least 0.5 and up to and including 50 kW/cm$^2$ and typically of at least 5 and up to and including 30 kW/cm$^2$, depending upon the source of energy (violet laser or excimer sources)

After imaging of negative-working imageable elements, a heating step might be used to accelerate the formation of a latent image. This heating step can be realized in so called "preheat units" that can be a separate machine or integrated into the processor that develops the imaged element. There are different types of preheat units. The most common ones use infrared radiation or hot air circulation, or combination thereof, to heat the imaged element. The temperature used for the purpose is from about 70 to about 200° C. and typically from about 90 to about 160° C.

Before developing the imaged element, a pre-rinse step might be carried out in a stand-alone apparatus or by manually rinsing the imaged element with water or the pre-rinse step can be carried out in a washing unit that is integrated in a processor used for developing the imaged element. For the free radical generating radiation-sensitive compositions and imageable elements, both the preheat unit and the pre-rinse unit are usually integrated into the processor used for developing the imaged element.

Development and Printing

After thermal imaging, the imaged elements are generally processed "off-press" using a processing solution having a pH of from about 4 to about 13 as described herein. Processing is carried out for a time sufficient to remove predominantly only the non-exposed regions of the outermost imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development can be accomplished using what is known as "manual" development, "dip" development, or processing with an automatic development apparatus (processor). In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally greater than 7 and up to 14. The imaged elements are generally developed using conventional processing conditions. Both aqueous alkaline developers and organic solvent-containing developers can be used.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-based developers include ND-1 Developer, Developer 980, Developer 1080, 2 in 1 Developer, 955 Developer, D29 Developer (described below), and 956 Developer (all available from Eastman Kodak Company).

In some instances, a single processing solution is used to both develop the imaged element by removing predominantly the non-exposed regions and also to provide a protective layer or coating over the entire imaged and developed surface. In this aspect, the processing solution can behave somewhat like a gum that is capable of protecting the lithographic image on the printing plate against contamination or damage (for example, from oxidation, fingerprints, dust, or scratches). Such processing solutions are described for example in copending and commonly assigned U.S. Ser. No. 12/104,544 (filed Apr. 17, 2008 by K. Ray, Yu, and Saraiya) that is incorporated herein by reference. Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalini condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

The processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). Still again, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following processing, the resulting lithographic printing plate can be used for printing with or without a separate rinsing step using water.

The resulting lithographic printing plate can also be baked in a postbake operation can be carried out, with or without a blanket or floodwise exposure to UV or visible radiation using known conditions. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Thus, the present invention provides the following embodiments, but is not limited to only these embodiments:

Embodiment 1: A negative-working imageable element comprising a substrate and having thereon a radiation-sensitive imageable layer, the imageable element further comprising a water-soluble overcoat disposed on the imageable layer, the overcoat comprising at least one poly(vinyl alcohol) having a saponification degree of at least 90%, an alkoxylation product of an alkanol, and either a 2-sulfonato succinic acid dialkylester or an alkoxylation product of a 1,4-butynediol.

Embodiment 2: The element of embodiment 1 wherein the overcoat, in its dry state, has a dynamic coefficient of friction of at least 0.25.

Embodiment 3: The element of embodiment 1 or 2 wherein the overcoat, in its dry state, has a dynamic coefficient of friction of at least 0.35.

Embodiment 4: The element of any of embodiments 1 to 3 wherein imageable element has an imaging sensitivity of from about 300 to about 450 nm or from about 700 to about 1400 nm, and the radiation-sensitive imageable layer comprises a composition that provides free radicals for polymerization.

Embodiment 5: The element of any of embodiments 1 to 4 wherein the poly(vinyl alcohol) is present in the overcoat in an amount of from about 60 to about 99 weight %, the an alkoxylation product of an alkanol is present in an amount of at least 0.05 weight %, and the 2-sulfonato succinic acid dialkylester or alkoxylation product of a 1,4-butynediol are present in an amount of at least 0.1 weight %, all weight percentages based on overcoat total dry weight.

Embodiment 6: The element of any of embodiments of 1 to 5 wherein the overcoat comprises a poly(vinyl alcohol) having a degree of saponification of from about 95 to about 99%.

Embodiment 7: The element of any of embodiments 1 to 6 wherein the overcoat further comprises a second water-soluble polymer in an amount of from about 2 to about 38 weight %, and the second water-soluble polymer is derived from one or more of a vinyl pyrrolidone, vinyl imidazole, vinyl caprolactone, ethyleneimine, and vinyl acetamide.

Embodiment 8: The element of any of embodiments of 1 to 7 wherein the alkoxylation product of an alcohol is present in an amount of from about 0.05 to about 0.7 weight %, and is derived from a linear or branched $C_4$ to $C_{20}$ alcohol or oxyalcohol.

Embodiment 9: The element of any of embodiments 1 to 8 wherein the 2-sulfonato succinic acid $C_4$ to $C_{18}$ dialkylester or ethylene oxide or propylene oxide product of a 1,4-butynediol that is present in an amount of from about 0.1 to about 3 weight %.

Embodiment 10: The element of any of embodiments 1 to 9 wherein the alkoxylation product of an alcohol is present in an amount of from about 0.1 to about 0.5 weight %, the 2-sulfonato succinic acid $C_4$ to $C_{18}$ dialkylester or ethylene oxide or propylene oxide product of a 1,4-butynediol that is present in an amount of from about 0.5 to about 2 weight %, the poly(vinyl alcohol) is present in an amount of from about 80 to about 95 weight %, and the overcoat further comprises a second water-soluble polymer that is not a poly(vinyl alcohol) and that is present in an amount of from about 2 to about 17 weight %.

Embodiment 11: The element of any of embodiments 1 to 10 wherein the 2-sulfonato succinic acid dialkylester and an alkoxylation product of a 1,4-butynediol are represented by the following Structures I and II, respectively:

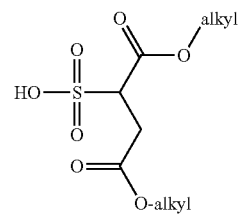

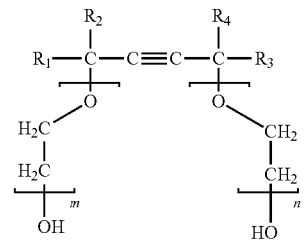

wherein "alkyl" represents an alkyl group having 4 to 18 carbon atoms, $R_1$ through $R_4$ are independently alkyl groups having 1 to 6 carbon atoms, and m and n are the same or different integers so that the sum of m and n is 1 to 30.

Embodiment 12: The element of any of embodiments 1 to 11 wherein the 2-sulfonato succinic acid dialkylester is represented by the following Structure III:

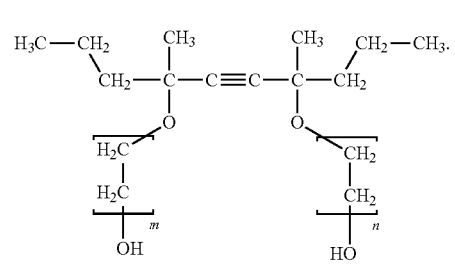

Embodiment 13: A method of providing a lithographic printing plate comprising:

A) imagewise exposing the imageable element of any of embodiments 1 to 12 to provide exposed and non-exposed regions, and B) processing the imagewise exposed imageable element to remove predominantly only the non-exposed regions.

Embodiment 14: The method of embodiment 13 wherein the imagewise exposure is carried out at a wavelength of from about 300 to about 450 nm.

Embodiment 15: The method of embodiment 13 wherein the imagewise exposure is carried out at a wavelength of from about 700 to about 1400 nm.

Embodiment 16: The method of any of embodiments 13 to 15 wherein the imageable element comprises an overcoat comprising an alkoxylation product of an alcohol is present in an amount of from about 0.1 to about 0.5 weight %, a 2-sulfonato succinic acid $C_4$ to $C_{18}$ dialkylester or ethylene oxide or propylene oxide product of a 1,4-butynediol that is present in an amount of from about 0.5 to about 2 weight %, the poly(vinyl alcohol) is present in an amount of from about 80 to about 95 weight %, and a second water-soluble polymer that is not a poly(vinyl alcohol) and that is present in an amount of from about 2 to about 17 weight %, wherein the 2-sulfonato succinic acid dialkylester and an alkoxylation product of a 1,4-butynediol are represented by the following Structures I and II, respectively:

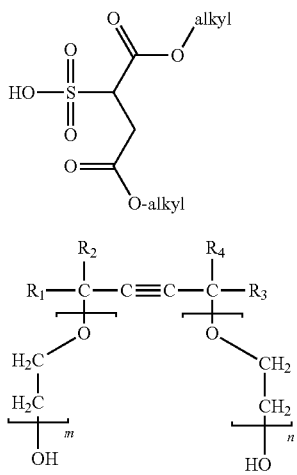

(I)

(II)

wherein alkyl represents an alkyl group having 4 to 18 carbon atoms, $R_1$ through $R_4$ are independently alkyl groups having 1 to 6 carbon atoms, and m and n are the same or different integers so that the sum of m and n is 1 to 30.

Embodiment 17: A lithographic printing plate obtained by any of embodiments 13 to 16.

Embodiment 18: A stack of multiple negative-working imageable elements of any of embodiments 1 to 12 wherein each imageable element comprises a substrate and has thereon a thermally-sensitive imageable layer, each imageable element further comprising a water-soluble overcoat disposed on the imageable layer, the overcoat comprising at least one water-soluble polymer, an alkoxylation product of an alkanol, and either a 2-sulfonato succinic acid dialkylester or an alkoxylation product of a 1,4-butynediol, wherein the multiple negative-working imageable elements are separated from each other with interleaf paper and the overcoat has a dynamic coefficient of friction of at least 0.25 with respect to the interleaf paper.

The following examples are provided to illustrate the practice of the invention but are by no means intended to limit the invention in any manner.

EXAMPLES

The following components were used in preparing the imageable elements used in the Examples:

| | |
|---|---|
| Kayamer PM-2 | Ester of 1 mol phosphoric acid and 1.5 mol hydroxyethyl methacrylate, available from Nippon Kayaku/Japan |
| Lutensol ® TO-5 | $C_{13}$ Oxo alcohol ethoxylate having 5 EO groups from BASF, Germany |
| Lutensol ® TO-10 | $C_{13}$ Oxo alcohol ethoxylate having 10 EO groups from BASF, Germany |
| Lutensol ® TO-20 | $C_{13}$ Oxo alcohol ethoxylate having 20 EO groups from BASF, Germany |
| Metolat ® 285 | Anionic surfactant having the structure shown in Structure (I) from Münzing GmbH, Germany, wherein the alkyl groups are $C_8$-residues |
| Monomer 1 | Reaction product of 1 mol of 2-(2-hydroxyethyl) piperidine with 2 mol of hydroxyethyl methacrylate and 2 mol of hexamethylene diisocyanate (30% solution in ethyl acetate) |
| Mowiol ® 4/98 | Poly(vinyl alcohol) from Kuraray, Germany, having a saponification degree of about 98% |
| Mowiol ® 4/88 | Poly(vinyl alcohol) from Kuraray, Germany, having a saponification degree of about 88% |
| NK Ester BPE-200 | Ethoxylated Bisphenol A having methacrylic end groups available from Shin Nakamura, Japan |
| Pigment 1 | Dispersion in propylene glycol monomethyl ether containing 9 wt. % of copper phthalocyanine and 1 wt. % of a poly(vinyl acetal) binder containing 39.9 mol % of vinyl alcohol, 1.2 mol % of vinylacetate, 15.4 mol % of acetal groups from acetaldehyde, 36.1 mol % of acetal groups from butyraldehyde, and 7.4 acetal groups from 4-formylbenzoic acid |
| PVP K15 | Poly(vinyl pyrrolidone) from ISP, USA |
| Q-1301 | N-nitrosophenylhydroxylamine aluminum salt from WAKO, Japan |
| Surfynol ® 440 | Nonionic surfactant from AIR PRODUCTS, Germany, |
| Surfynol ® 465 | Nonionic surfactant from AIR PRODUCTS, Germany, |

As used below, component B refers to an alkoxylation product of an alkanol as required in the practice of this invention and component C refers to either a 2-sulfonato succinic acid dialkylester or an alkoxylation product of a 1,4-butynediol as required in the practice of this invention.

Invention Examples 1 to 6 and Comparative Examples 1 to 9

An electrochemically roughened and anodized aluminum foil with an oxide weight of 3 g/m² was subjected to an after treatment using an aqueous solution of poly(vinyl phosphoric acid). The average roughness of the surface was 0.55 μm. Imageable layer coating compositions corresponding to TABLES I and III below were applied to the substrate after filtering using a wire bar coater. The coatings were dried for 4 minutes at 90° C. to provide a dry coating weight of 1.7 g/m².

The dried imageable layers were overcoated with an aqueous solution as described in TABLES II and III below using a wire bar coater to provide lithographic printing plate precursors having a dry overcoat weight of 2 g/m² after drying for 4 minutes at 90° C.

The UGRA/FOGRA Postscript Strip version 2.0 EPS (available from UGRA), which contains different elements for evaluating the quality of the copies, was used for imaging the imageable elements using the ProSetter platesetter from Heidelberger Druckmaschinen. The exposure wavelength was 405 nm and the energy was 50 μJ/cm². The imaged elements were developed in a Raptor 68 Polymer processor from Glunz & Jenzen, Denmark using the following processor settings: preheat temperature 110° C., prewash section with water recirculation, developer temperature 23° C., developer Kodak 500, regenerator Kodak 550R, regeneration rate 80 ml/m², post rinse section with water recirculation, gumming section filled with Kodak 850S.

"Latent image keeping" was measured by keeping an exposed plate sample for 15 minutes at 22° C. and 60% RH followed by processing as described above. The tonal value of a 50% screen at 175 lpi was compared with a sample that was processed directly after imaging. The "latent image keeping" was accessed as follows: very good=tonal value decreases less than 1%, good=tonal value decreases less than 2%, bad=tonal value decreases less than 4%, very bad=tonal value decreases more than 4%.

The "dynamic friction coefficients" were determined by measuring the force to pull a body having a weight of 100 g and a surface in contact with the surface of the imageable element covered with interleaf paper at a speed of 10 cm/sec. The "dynamic friction coefficient" was calculated by dividing the needed force to pull the body by the weight of the body. The interleaf paper used in these tests was Pergotec 35 g/m² paper from Pfleiderer, Germany.

Definition of the "surface defect rate" of the overcoat (fully exposed and developed plate is evaluated for defects >50 μm) were as follows: very good=no defect, good=1 to 2 defect per m², bad=3 to 5 defects per m², very bad=more than 5 defects per m².

The definition of "foaming of the overcoat solution" was as follows: 20 ml of overcoat formulation were shaken in a 100 ml bottle for 10 seconds. The time needed to reduce the foam on the liquid surface to less than 2 mm thickness was measured with the following assessment: good=less than 2 minutes need, medium=2 to 5 minutes need, bad=more than 5 minute needed.

TABLE III below shows the composition of overcoat used in the Invention Examples and Comparative Examples and the influence on the printing plate performance. Invention Examples 1 to 6 show that the combination of components B and C and a poly(vinyl alcohol) having a high saponification degree according to the present invention resulted in imageable elements having good "latent image keeping", a "dynamic friction coefficient" of at least 0.35, a low "overcoat defect rate", and less tendency of "foaming of the overcoat solution".

In contrast, the results for Comparative Examples 1 and 2 show that use of a poly(vinyl alcohol) with a 88% saponification degree can be coated with a low "overcoat defect rate" even without the combination of component B and C but the "latent image keeping" was very bad. Use of only Component C in the overcoat resulted in imageable elements with acceptable "dynamic friction" but they exhibited too high an "overcoat defect rate" at low concentration (Comparative Example 6). Use of overcoats with higher amounts of component C (Comparative Examples 7 and 8) provided good "overcoat defect rates" but the "dynamic friction coefficients" were too low resulting in problems during manufacturing and transportation because of too high slipperiness of the stacks of imageable elements separated with interleaf paper. When only component B was used in the overcoat, the resulting "overcoat defect rate" was too high.

TABLE I

| | |
|---|---|
| 70 g | propylene glycol monomethyl ether |
| 5 g | Acetone |
| 2.02 g | copolymer derived from methacrylic acid, allyl methacrylate, benzyl methacrylate, and N-isopropyl methacrylamide (molar ratio of 20/40/20/20) |
| 2.00 g | Pigment 1 |
| 0.04 g | Kayamer PM-2 |
| 6.25 g | Monomer 1 |
| 0.33 g | HB-NK Ester PBE 200 |
| 0.62 g | 2-Phenyl-4-(2-chlorophenyl)-5-(4-N,N-diethylaminophenyl)-oxazole-1,3 |
| 0.15 g | 2,2-Bis-(2-chlorophenyl)-4,5,4',5'-tetraphenyl-2'H-[1,2]biimidazolyl |
| 0.28 g | Mercapto-3-triazole |
| 0.70 g | Q1301 (1% solution in propylene glycol monomethyl ether) |

TABLE II

| | |
|---|---|
| 25 g | Water |
| 56 g | 15% Solution of a polyvinyl alcohol (PVA) corresponding to TABLE III in water |
| 10 g | 15% Solution of PVP K15 in water |
| X g | Component B corresponding to TABLE III |
| Y g | Component C corresponding to TABLE III |

TABLE III

| | PVA | Component B | Component C | "Dynamic friction coefficient" | "Latent image keeping" | "Surface defect rate" | "Foaming of the overcoat solution" |
|---|---|---|---|---|---|---|---|
| Invention Example 1 | Mowiol ® 4/98 | 0.08 g Metolat ® 285 | 0.016 g Lutensol ® TO-5 | 0.35 | very good | good | very good |
| Invention Example 2 | Mowiol ® 4/98 | 0.064 g Surfynol ® 440 | 0.016 g Lutensol ® TO-10 | 0.36 | very good | very good | good |
| Invention Example 3 | Mowiol ® 4/98 | 0.08 g Metolat ® 285 | 0.016 g Lutensol ® TO-20 | 0.37 | very good | good | good |
| Invention Example 4 | Mowiol ® 4/98 | 0.064 g Surfynol ® 465 | 0.016 g Lutensol ® TO-10 | 0.35 | very good | good | good |
| Invention Example 5 | Mowiol ® 4/98 + Mowiol ® 4/88[1)] | 0.08 g Metolat ® 285 | 0.01 g Lutensol ® TO-10 | 0.38 | good | very good | very good |
| Invention Example 6 | Mowiol ® 4/98 + Mowiol ® 4/88[1)] | 0.064 g Surfynol ® 440 | 0.01 g Lutensol ® TO-10 | 0.36 | good | very good | very good |
| Comparative Example 1 | Mowiol ® 4/88 | None | None | 0.46 | very bad | good | good |
| Comparative Example 2 | Mowiol ® 4/88 | 0.064 g Surfynol ® 440 | 0.016 g Lutensol ® TO-10 | 0.37 | very bad | very good | very good |
| Comparative Example 3 | Mowiol ® 4/98 | 0.08 g Metolat ® 285 | None | 0.45 | very good | bad | bad |
| Comparative Example 4 | Mowiol ® 4/98 | None | 0.016 g Lutensol ® TO-5 | 0.39 | very good | bad | very good |
| Comparative Example 5 | Mowiol ® 4/98 | 0.064 Surfynol ® 440 | None | 0.45 | very good | bad | bad |
| Comparative Example 6 | Mowiol ® 4/98 | None | 0.016 g Lutensol ® TO-10 | 0.37 | very good | bad | very good |
| Comparative Example 7 | Mowiol ® 4/98 | None | 0.16 g Lutensol ® TO-10 | 0.25 | very good | very good | very good |
| Comparative Example 8 | Mowiol ® 4/98 | None | 0.08 g Lutensol ® TO-10 | 0.26 | very good | good | very good |

TABLE III-continued

| | PVA | Component B | Component C | "Dynamic friction coefficient" | "Latent image keeping" | "Surface defect rate" | "Foaming of the overcoat solution" |
|---|---|---|---|---|---|---|---|
| Comparative Example 9 | Mowiol ® 4/98 | 0.24 g Surfynol ® 440 | None | 0.40 | very good | bad | bad |

1)Mowiol ® 4/98 + Mowiol ® 4/88 weight ratio = 8:2

The invention has been described in detail with particular reference to certain preferred embodiments thereof, but it will be understood that variations and modifications can be effected within the spirit and scope of the invention.

The invention claimed is:

1. A negative-working imageable element comprising a substrate and having thereon a radiation-sensitive imageable layer,
said imageable element further comprising a water-soluble overcoat disposed on said imageable layer, said overcoat comprising:
at least one poly(vinyl alcohol) having a saponification degree of at least 90%,
an alkoxylation product of an alkanol, and
an alkoxylation product of a 1,4-butynediol that is represented by Structure (II) below:

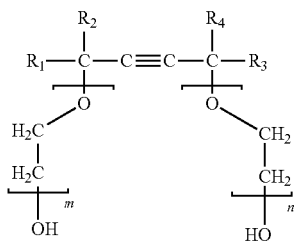

wherein $R_1$ through $R_4$ are independently alkyl groups having 1 to 6 carbon atoms, and m and n are the same or different integers so that the sum of m and n is 1 to 30.

2. The element of claim 1 wherein said overcoat, in its dry state, has a dynamic coefficient of friction of at least 0.25.

3. The element of claim 1 wherein said overcoat, in its dry state, has a dynamic coefficient of friction of at least 0.35.

4. The element of claim 1 wherein imageable element has an imaging sensitivity of from about 300 to about 450 nm or from about 700 to about 1400 nm, and said radiation-sensitive imageable layer comprises a composition that provides free radicals for polymerization.

5. The element of claim 1 wherein said poly(vinyl alcohol) is present in said overcoat in an amount of from about 60 to about 99 weight %, said an alkoxylation product of an alkanol is present in an amount of at least 0.05 weight %, and said alkoxylation product of a 1,4-butynediol is present in an amount of at least 0.1 weight %, all weight percentages based on overcoat total dry weight.

6. The element of claim 1 wherein said polymer binder in said overcoat is a poly(vinyl alcohol) having a degree of saponification of from about 95 to about 99%.

7. The element of claim 1 wherein said overcoat further comprises a water-soluble polymer that is not a poly(vinyl alcohol) in an amount of from about 2 to about 38 weight %, and said second water-soluble polymer is derived from one or more of a vinyl pyrrolidone, vinyl imidazole, vinyl caprolactone, ethyleneimine, and vinyl acetamide.

8. The element of claim 1 wherein said alkoxylation product of a 1,4-butynediol is present in an amount of from about 0.1 to about 3 weight %.

9. The element of claim 1 wherein said alkoxylation product of an alkanol is present in an amount of from about 0.1 to about 0.5 weight %, said alkoxylation product of a 1,4-butynediol is present in an amount of from about 0.5 to about 2 weight %, said poly(vinyl alcohol) is present in an amount of from about 80 to about 95 weight %, and said overcoat further comprises a second water-soluble polymer that is not a poly(vinyl alcohol) and that is present in an amount of from about 2 to about 17 weight %.

10. The element of claim 1 wherein said alkoxylation product of a 1,4-butynediol is represented by the following Structure III:

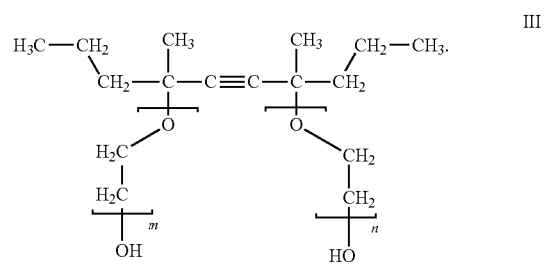

11. A method of providing a lithographic printing plate comprising:
A) imagewise exposing said imageable element of claim 1 to imaging radiation to provide exposed and non-exposed regions, and
B) processing said imagewise exposed imageable element to remove predominantly only said non-exposed regions.

12. The method of claim 11 wherein said imagewise exposure is carried out at a wavelength of from about 250 nm to about 450 nm.

13. The method of claim 11 wherein said imagewise exposure is carried out at a wavelength of from about 700 to about 1400 nm.

14. The method of claim 11 wherein said imageable element comprises said overcoat comprising said alkoxylation product of an alkanol that is present in an amount of from about 0.1 to about 0.5 weight %, said alkoxylation product of a 1,4-butynediol that is present in an amount of from about 0.5 to about 2 weight %, said poly(vinyl alcohol) that is present in an amount of from about 80 to about 95 weight %, and a second water-soluble polymer that is not a poly(vinyl alcohol) and that is present in an amount of from about 2 to about 17 weight %.

* * * * *